United States Patent [19]
Browning

[11] Patent Number: 4,717,883
[45] Date of Patent: Jan. 5, 1988

[54] METHOD AND APPARATUS FOR REDUCING ERRORS IN A SAMPLING SYSTEM UTILIZING AN ERROR-SAMPLED FEEDBACK LOOP

[75] Inventor: Carl Browning, Wilmington, Mass.

[73] Assignee: Analog Devices, Inc., Norwood, Mass.

[21] Appl. No.: 892,940

[22] Filed: Aug. 4, 1986

[51] Int. Cl.[4] .............................................. G11C 27/02
[52] U.S. Cl. ..................................... 328/151; 307/353
[58] Field of Search ................ 307/352, 353; 328/150, 328/151

[56] References Cited

U.S. PATENT DOCUMENTS 3,659,211 4/1972 Norton ................................. 307/353
4,283,713 8/1981 Philipp ................................ 328/151

OTHER PUBLICATIONS

A. C. Hansen, "Burst Mode Sampling Amplifier" IBM Technical Disclosure Bulletin, vol. 14, No. 7, Dec. 1971, pp. 2196-2197.
"Section 3—Basic Sampling Principles," 7S11 Sampling Unit Instruction Manual, Tektronix, Inc., Nov. 1984, pp. 3-1 through 3-9.
"Section 4—Circuit Description," 7S11 Sampling Unit Instruction Manual, Tektronix, Inc., Nov. 1984, pp. 4-1 through 4-11.

Primary Examiner—John Zazworsky
Attorney, Agent, or Firm—Wolf, Greenfield & Sacks

[57] ABSTRACT

Apparatus for sampling a repetitive input signal includes a sampling bridge responsive to a sampling strobe for sampling the input signal at an equivalent time point during its cycle, an error-sampled feedback loop for providing a sampling loop output representative of the input signal sample amplitude by determining and storing the difference between the input signal sample and the attenuated loop output, and a timebase circuit for generating the sampling strobe. The timebase circuit includes a circuit for repeating the sampling strobe at least twice at each equivalent time point during succesive cycles of the input signal for reduction of errors in the sampling loop output.

6 Claims, 4 Drawing Figures

METHOD AND APPARATUS FOR REDUCING ERRORS IN A SAMPLING SYSTEM UTILIZING AN ERROR-SAMPLED FEEDBACK LOOP

FIELD OF THE INVENTION

This invention relates to sampling systems used in electronic measurement and instrumentation and more particularly, to a sampling technique for reducing errors in an error sampled feedback loop.

BACKGROUND OF THE INVENTION

In measurement and instrumentation systems, it is frequently necessary to observe or measure high frequency signal waveforms. In oscilloscopes, the waveforms are displayed on a cathode ray tube for evaluation by an observer. In measurement systems, the waveforms are evaluated as to amplitude, risetime, overshoot, pulse width and the like. For extremely fast waveforms having risetimes on the order of nanoseconds or less, conventional measurement techniques are inadequate, and sampling techniques have been utilized. In one type of sampling, one sample of the test waveform is taken during each cycle. On successive cycles, samples are taken at progressively later equivalent time points in the cycle until samples of a complete cycle are taken. Then the process is repeated. The samples can be used to illuminate points on an equivalent time display on an oscilloscope. In measurement systems, the samples of equivalent time points can be digitized and stored for later processing. For example, the digitized samples may be compared with upper and lower limits to evaluate performance.

One common sampling system utilizes an error-sampled feedback loop. The test signal is sampled at a prescribed equivalent time point during its cycle. The sample is stored in an analog memory. The output of the analog memory is a linear function of the test signal amplitude at the equivalent time point. In a feedback arrangement, the memory output is fed back to the sampling input and, on successive samples, the difference between the test signal and the memory output are supplied to the input of the memory for summation. As a result, the loop output is required to change only by the difference between the instantaneous signal sample and the previous signal sample, rather than from ground or an arbitrary reference level.

The product of all gain and attenuation stages in both the forward and feedback paths of the loop is the "loop gain." The loop gain is usually about unity, while the closed loop forward gain may have any desired value. When the loop gain in the error-sampled feedback loop is exactly unity, the loop output is an accurate representation of the signal sample. In practice however, the loop gain may not be exactly unity due to drift, component tolerances and the like. In addition, the loop is frequently operated at less than unity loop gain to reduce the effect of random noise on the measured signal. Furthermore, the transient response characteristics of the loop can result in loop output errors. The above factors give rise to errors in the measured signal sample relative to the actual signal amplitude. For certain applications such as oscilloscope displays, small errors may be acceptable. In other applications, such as measurement systems which must accurately evaluate the test signal, it is desirable to minimize errors introduced by the measurement system, so that any variations can be attributed to the signal under test.

It is a general object of the present invention to provide improved sampling systems utilizing an error-sampled feedback loop.

It is another object of the present invention to provide methods and apparatus for reducing errors in sampling systems utilizing an error-sampled feedback loop.

It is a further object of the present invention to provide methods and apparatus for reducing errors in a sampling system by taking multiple samples at the same equivalent time point on successive cycles of the waveform under test, allowing the sampling loop to servo to final value.

SUMMARY OF THE INVENTION

According to the present invention, these and other objects and advantages are acheived in the apparatus for sampling a repetitive test input signal. The apparatus comprises sampling means responsive to a sampling strobe signal for sampling the input signal at an equivalent time point during successive cycles and providing input signal samples, error-sampled feedback loop means responsive to the input signal samples for providing a sampling loop output representative of the input signal sample amplitude, and timebase means for generating the sampling strobe signal, synchronized to occur at progressively later equivalent time points during successive cycles of the input signal so that the test signal is sampled at equivalent time points through at least a portion of its cycle. In accordance with the invention, the timebase means includes means for repeating the sampling strobe signal at least twice in succession at each equivalent time point during successive cycles of the input signal, for reducing errors in the sampling loop output. The timebase means preferably includes a fast ramp generator synchronized to the input signal and a slow ramp generator which is incremented after N sampling cycles. A comparator generates a sampling strobe when the fast ramp crosses the slow ramp.

According to another aspect of the invention, there is provided a method for sampling a repetitive input signal. The method comprises the steps of sampling the input signal at an equivalent time point during successive cycles and providing an input signal sample each time, in an error-sampled feedback loop determining and storing the difference between the input signal sample and the previous signal sample such that the output of the loop represents the amplitude of the input signal sample, and repeating the sampling of the input signal at the same equivalent time point during successive cycles of the input signal, for reduction of errors in the feedback loop output.

BRIEF DESCRIPTION OF THE DRAWINGS

For a better understanding of the present invention together with other and further objects, advantages and capabilities thereof, reference may be had to the accompanying drawings which are incorporated herein by reference, and in which.

DETAILED DESCRIPTION OF THE INVENTION

Figure 1:
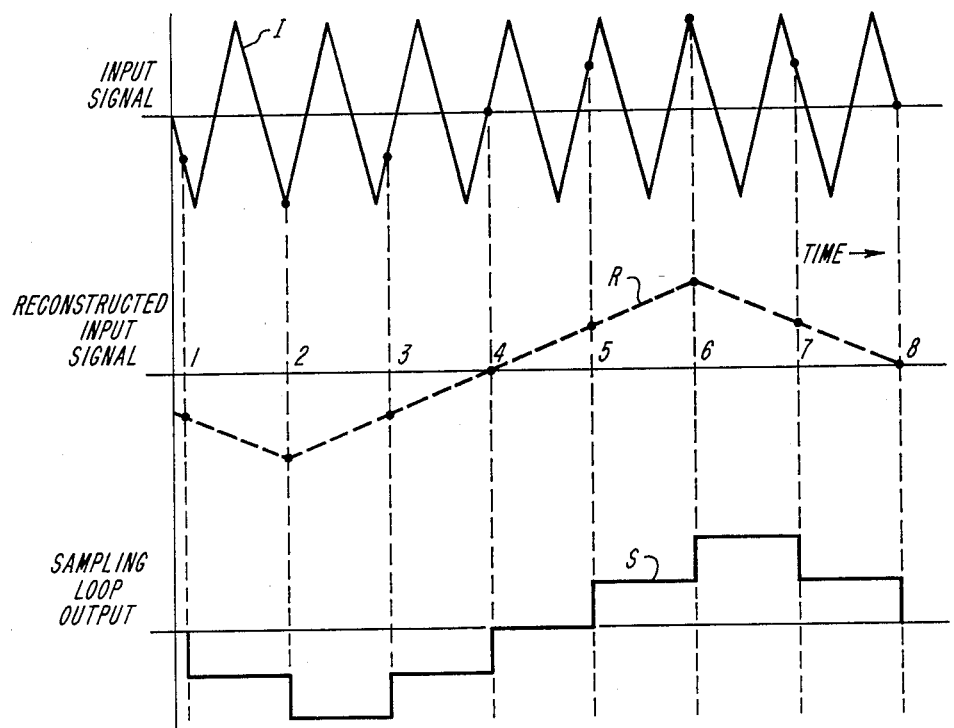
FIG. 1 is a graphic illustration of equivalent time sampling.

Equivalent time sampling with one sample per input signal period is illustrated in FIG. 1. The input signal I is periodic and has an arbitrary wave shape. Input signal I is sampled once each cycle at equivalent time points 1, 2, 3, 4, etc. Successive equivalent time points occur progressively later in the cycle of the input signal. When the sampling has proceeded through an entire cycle of the input signal, the input waveform is reconstructed from the samples. The sampling loop output S in FIG. 1 depicts the output of a sampling loop circuit which samples input signal I. The reconstructed input signal R in FIG. 1 represents an oscilloscope display derived from the sampling loop output S. The sampling frequency and the width of the sampling window are matters of choice depending on the input signal frequency and risetime, and the desired accuracy. Such sampling techniques, wherein one sample is taken at each equivalent time point of the input signal cycle, are well known in the prior art. As the number of equivalent time points per cycle of the input signal is increased, the accuracy of the wave form reproduction is improved, but such accuracy is obtained at the expense of total acquisition time. It will be understood that FIG. 1 is intended to illustrate the principle of equivalent time sampling and that a practical system would utilize much more closely-spaced equivalent time points.

Figure 2:
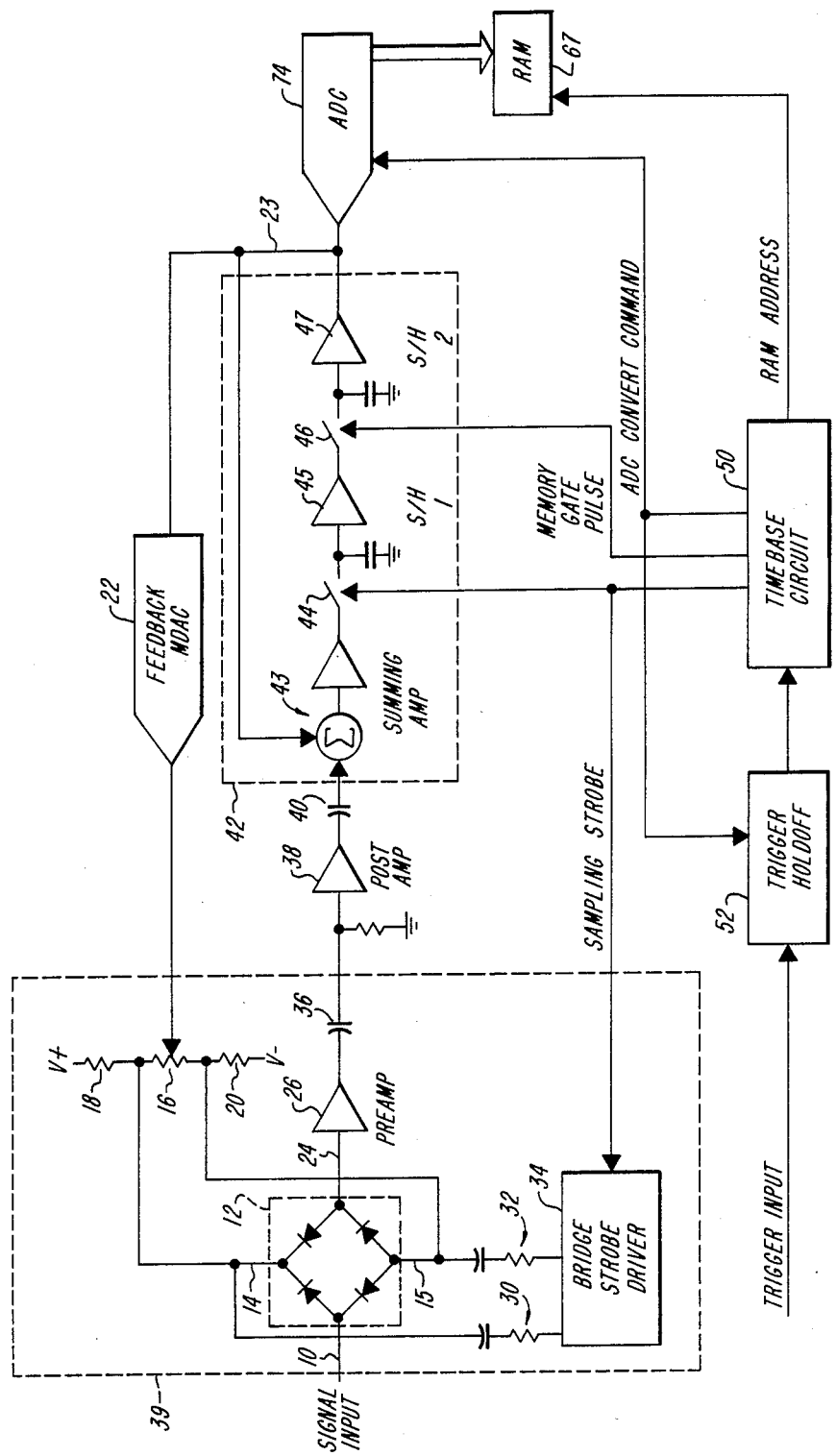
FIG. 2 is a block diagram of an error-sampled feedback loop for performing equivalent time sampling.

An error-sampled feedback loop for performing the above-described sampling is shown in FIG. 2. A test input signal is applied to a terminal 10 of a diode bridge 12. A feedback signal is applied to terminals 14 and 15 of the diode bridge 12. Terminal 14 is connected to one end of a potentiometer 16 and to a resistor 18. The other lead of the resistor 18 is connected to a positive voltage supply V+. The terminal 15 is connected to the other end of the potentiometer 16 and to a resistor 20. The other end of the resistor 20 is connected to a negative voltage supply V−. The wiper of the potentiometer 16 is connected through a variable attenuator 22 to the output 23 of the loop. The variable attenuator 22 can be a multiplying digital to analog converter such as a type AD7545 manufactured by Analog Devices. The resistors 18 and 20 and the potentiometer 16 balance the diode bridge and feed the attenuated loop output back to the diode bridge 12 so that it is summed with the input signal. Terminal 24 of the diode bridge 12 is connected to the input of a preamplifier 26.

The diode bridge 12 is normally biased in an off condition. Terminals 14 and 15 are connected through R-C coupling networks 30, 32, to a bridge strobe driver 34. When a sampling strobe is applied to the strobe driver 34, pulse signals are applied to the bridge 12 through terminals 14 and 15, to turn the bridge on for a brief sampling period. During the sampling period when the diode bridge is turned on, the output signal on the lead 24 represents the difference between the input signal at terminal 10 and the attenuated loop output across leads 14 and 15. This difference is referred to as an error signal; the error signal is amplified by the preamplifier 26 and passes through a coupling capacitor 36 to a post amplifier 38. The sampling head or front end 39 enclosed within dashed lines in FIG. 2 is the only portion of the system required to operate at the high frequency of the input signal. The amplified error signal output of the amplifier 38 is coupled through a coupling capacitor 40 to an analog memory 42.

The analog memory 42 includes a summing amplifier 43 which sums the output of the post amplifier 38 and the loop output 23. The output of summing amplifier 43 is connected through a first analog gate 44 to a first sample and hold circuit 45. The analog gate 44 is momentarily closed by the sampling strobe signal and the input signal is stored in first sample and hold circuit 45. The output of sample and hold circuit 45 is connected through a second analog gate 46 to a second sample and hold circuit 47. The second analog gate 46 is momentarily closed by a memory gate pulse occurring after the sampling strobe signal and the output of first sample and hold circuit 44 is stored in second sample and hold circuit 47, the output of which is the loop output 23. The loop output 23 is fed back to the summing amplifier 43 to form a closed loop analog memory 42. The disclosed closed loop analog memory 42, in which sample and hold circuit 47 is slower but more accurate than sample and hold circuit 45, is extremely accurate.

The amplified error signal is gated into the analog memory 42 and the analog memory contents are altered to reflect the previous sample amplitude plus the error signal amplitude. The analog memory output thus represents the amplitude of the most recent input signal sample.

The variable attenuator 22 feeds a portion of the loop output 23 back to the diode bridge 12 for summing with the input signal as described above. The sampling strobe and the memory gate pulse are supplied from a timebase circuit 50, which is described in detail hereinafter. In one example of an error-sampled feedback loop, the preamp 26 is a discrete transistor circuit, the post amplifier 38 is a discrete transistor circuit, the summing amplifier 43 is an HA2525 operational amplifier from Harris Semiconductor and sample and hold circuits 45 and 47 are types HTC-0300 and AD389, respectively, both from Analog Devices. The analog gates 44 and 46 are, in the present example, included as part of the sample and hold circuits 45 and 47, respectively.

Figure 3:
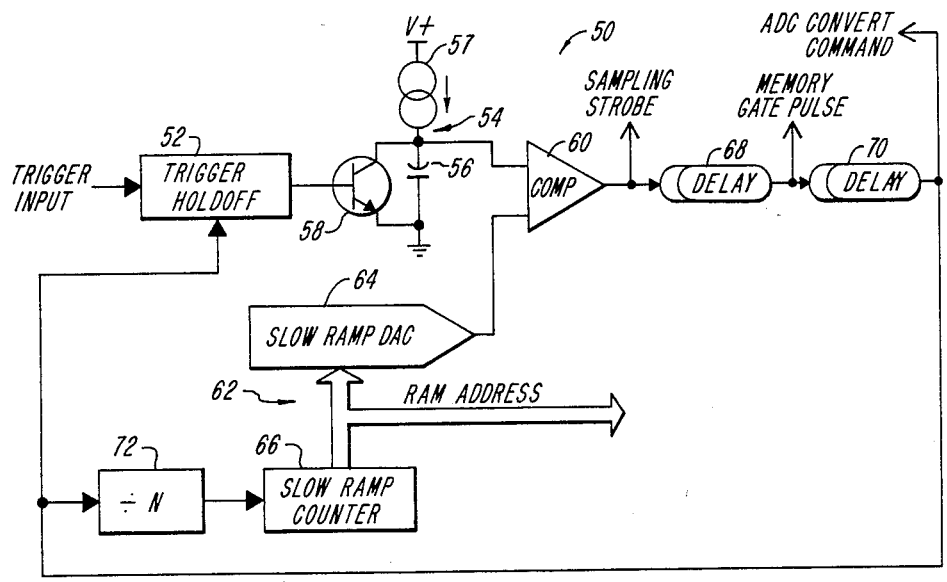
FIG. 3 is a block diagram of the timebase circuit shown in FIG. 2.

A simplified block diagram of the timebase circuit 50 is shown in FIG. 3.

A trigger holdoff latch 52 is also shown in FIG. 3. The interconnection of the timebase circuit 50 and the trigger holdoff latch 52 to the remainder of the apparatus is illustrated in FIG. 2. A trigger input signal (supplied by conventional circuitry not shown) is derived from the input signal waveform, typically by detecting when the input signal crosses a threshold voltage. Thus, the trigger input signal is synchronized to the input signal and occurs at the same point in each cycle of the input signal. The trigger input signal is applied to the trigger holdoff latch 52, such as a type F100131 integrated circuit from Fairchild Semiconductor, which is set by the trigger input signal and is reset upon completion of the sampling cycle. The output of the trigger holdoff latch 52 is connected to a fast ramp generator 54. The fast ramp generator 54 provides a ramp signal output starting when the trigger holdoff latch 52 is set and continuing until the latch 52 is reset. The fast ramp generator 54 can be of conventional design, such as a capacitor 56 supplied from a constant current source 57. The current source 57 or the capacitor 56 value, or both, can be programmed to vary the ramp rate. The ramp generator 54 is reset by a transistor switch 58 connected across the capacitor 56. The output of the fast ramp generator 54 is supplied to one input of a comparator 60. The other input of the comparator 60 is supplied from the output of a slow ramp generator 62 comprising a digital-to-analog converter (DAC) 64 and a counter 66. The outputs of the counter 66 are connected to the inputs of the DAC 64 so that when the counter 66 is incremented, the DAC 64 produces a staircase output signal which approximates a ramp signal for sufficiently small steps. The outputs of the counter 66 can also be utilized to address a RAM 67 (FIG. 2) for storage of the digitized sampling loop outputs.

The output of the comparator 60 is the sampling strobe which is applied to the bridge strobe driver 34, to first analog gate 44 and to a delay circuit 68. The output of the delay circuit 68 is the memory gate pulse which is applied to second analog gate 46 and to a second delay circuit 70. The output of the delay circuit 70 is supplied to reset the trigger holdoff latch 52 and as an input to a divide-by-N circuit 72. The output of delay circuit 70 can be utilized as a command to an analog-to-digital converter 74 (FIG. 2) for digitizing the output of the feedback loop, if so desired. Typically, the delay circuits 68, 70 are monostable multivibrators such as type SN74LS123 integrated circuits having output pulses of 200 nanoseconds and 3 microseconds, respectively. The divide-by-N circuit is typically a binary counter, which increments the counter 66 after receiving N pulses from the delay circuit 70. As a result, the timebase circuit 50 obtains N samples of the input signal at each equivalent time point. In an example of the present invention, the comparator 60 is an AD9687BD from Analog Devices, the DAC 64 is a type AD7545 manufactured by Analog Devices, the counter 66 comprises SN74LS191 counters and the divide-by-N circuit 72 is a type SN74LS160 binary counter.

Figure 4:
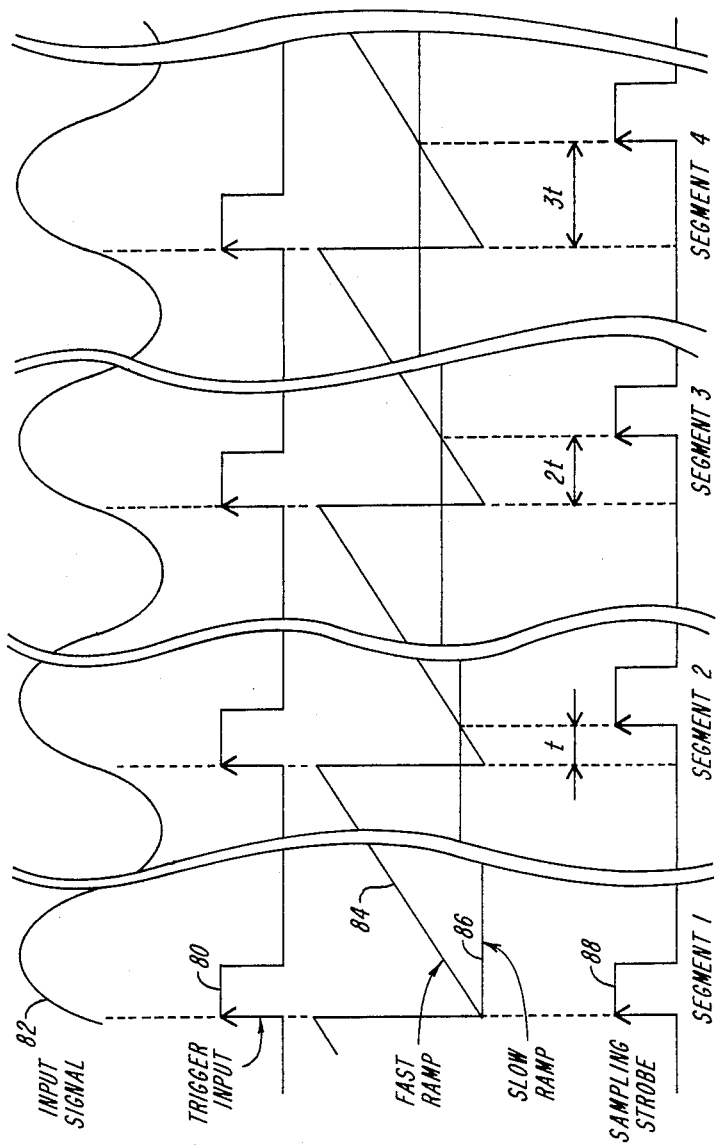
FIG. 4 is a graphic illustration of the waveforms associated with the timebase circuit of FIG. 3.

The operation of the timebase circuit 50 is illustrated in FIG. 4. The waveforms are broken at several points to more clearly illustrate the operation. The trigger input signal 80 is derived by detection of a prescribed positive-going level on the input signal 82. Therefore, the trigger input signal 80 is synchronized to the input signal 82. The fast ramp 84 is initiated by the trigger input signal 80, and repeats during each cycle of the input signal 82. The slow ramp 86 starts at the beginning of an acquisition cycle and increases in amplitude each time N samples have been taken, as described above.

In FIG. 4, the slow ramp 86 appears essentially constant during each waveform segment since its rate of increase is relatively slow. The fast ramp 84 and the slow ramp 86 are superimposed to illustrate the operation of the comparator 60. A sampling strobe 88 is generated when the fast ramp 84 exceeds the slow ramp 86. During segment 1, this occurs at the time of the trigger input signal 80. The sampling strobe 88 samples the input signal 82 at the first equivalent time point in segment 1. The sampling at the first equivalent time point is repeated N times since the counter 66 is not incremented until N samples have been taken. After N samples, the counter 66 is incremented and the slow ramp 86 amplitude increases as shown in segment 2. Now, the fast ramp 84 does not cross the slow ramp 86 until time "t" after the trigger input signal 80. The sample during segment 2 is taken at a later point in the input signal 82 cycle and is again repeated N times. During segment 3, the slow ramp 86 is further increased and the sampling strobe 88 is delayed by a time "2t" from the trigger input signal and is again repeated N times. In like manner, the sampling at each equivalent time point in the input signal waveform is repeated N times until the entire input signal 82 waveform, or a desired portion thereof, has been sampled. At this time, the signal acquisition is completed and the slow ramp 86 is reset.

The reason for taking N samples at each equivalent time point can be understood with reference to FIG. 2. The error signal supplied to the analog memory 42 depends on the difference between the attenuated loop output and the input signal sample. On the first sample at a given equivalent time point, the error signal can be relatively large depending on the rate of change of the input signal. However, on succeeding samples at the same equivalent time point of the input signal, the difference between the attenuated loop output and the input signal sample approaches zero. Thus, the error in the loop output caused by non-unity loop gain, transients or other factors, approaches zero. As a result, the sampling technique in accordance with the present invention utilizes the final one of the N samples to provide an extremely accurate sampling of the input signal. In a circuit constructed in accordance with the present invention as shown and described hereinabove, it has been found that better than 10 bit resolution can be achieved.

It will be understood that the technique in accordance with the present invention involving the taking of multiple successive samples at each equivalent time point can be applied in any error-sampled feedback loop. While the technique has been implemented by counting sampling strobe signals or pulses and incrementing a slow ramp generator after N strobe pulses, it will be understood that any technique for repeating the sampling at each equivalent time point is encompassed within the scope of the present invention. The timebase circuit can be implemented digitally through the use of phase locked loops and/or digital counters, thereby eliminating the fast and slow ramps while maintaining the novel technique of multiple sampling of each equivalent time point on the input signal waveform. Two or more samples may be taken at each equivalent time point depending on the desired accuracy of the loop output. The value of N depends on the error requirements. As N increases, the error asymptotically approaches zero. Typically, values of N in the range between 2 and 16 are utilized.

While it has been shown and described what is at present considered the preferred embodiments of the present invention, it will be understood by those skilled in the art that various changes and modifications may be made therein without departing from the scope of the invention as defined by the appended claims.

What is claimed is:

1. Apparatus for sampling a repetitive test input signal comprising:

sampling means responsive to a sampling strobe signal for sampling the input signal at an equivalent time point during successive cycles thereof and providing input signal samples;

error-sampled feedback loop means responsive to the input signal samples for providing a sampling loop output signal representative of the input signal sample amplitude, said feedback loop means including attenuator means for attenuating said loop output signal and providing an attenuated loop output, said feedback loop means providing said output signal by determining and storing the difference between each input signal sample and the attenuated loop output; and timebase means for generating said sampling strobe signal, synchronized to occur at progressively later equivalent time points during successive cycles of the input signal, so that the input signal is sampled at equivalent time points through at least a portion of its cycle, said timebase means including means for repeating said sampling strobe signal at least twice in succession to obtain at least two samples at each equivalent time point during successive cycles of the input signal for reducing errors in the sampling loop output.

2. Sampling apparatus as defined in claim 1 wherein said repeating means includes:

fast ramp generating means for generating a fast ramp signal synchronized with said input signal;

slow ramp generating means for generating a slow ramp signal;

comparator means for comparing said fast ramp signal and said slow ramp signal and producing said sampling strobe signal when said fast ramp signal equals said slow ramp signal; and means for incrementing the amplitude of said slow ramp signal after generation of at least two sampling strobe signals at each equivalent time point during successive cycles of the input signal.

3. Sampling apparatus as defined in claim 2 wherein said slow ramp generating means comprises a digital-to-analog converter and a first binary counter having its outputs coupled to the digital inputs of the digital-to-analog converter, and said incrementing means includes a second binary counter which is incremented at the completion of each sampling cycle and which increments said first counter after obtaining said at least two samples.

4. A method for sampling a repetitive input signal comprising the steps of:

sampling the input signal at least twice at each equivalent time point of the input signal during successive cycle thereof and providing at least two input signal samples for each such time point; and determining and storing the difference between each input signal sample and previous signal sample, in a error-sampled feedback loop, such that the output of said loop represents the amplitude of said input signal samples.

5. In apparatus for sampling a repetitive test input signal, the apparatus comprising error sampled feedback loop means responsive to the input signal and to a sampling strobe for sampling the input signal at an equivalent time point during its cycle and providing asn input signal sample and for providing a sampling loop output representative of the input signal sample amplitude by determining and storing the difference between the input signal sample and the sampling loop output, and timebase means for generating said sampling strobe at progressively later equivalent time points during successive cycles of the input signal so tha the input signal is sampled at equivalent time points through at least a portion of its cycle, the improvement comprising:

said timebase means including means for repeating said sampling strobe at least twice to obtain at least two samples at each equivalent time point during successive cycles of the input signal for reduction of erros in the sampling loop output.

6. Improved sampling apparatus as defined in claim 5 wherein said repeating means includes means for counting sampling strobes and for advancing to a second equivalent time point after taking said at least two samples at the first equivalent time point.

* * * * *